(12) United States Patent
Natarajan et al.

(10) Patent No.: US 7,708,856 B2
(45) Date of Patent: *May 4, 2010

(54) HOT PRESSING CERAMIC DISTORTION CONTROL

(75) Inventors: Govindarajan Natarajan, Poughkeepsie, NY (US); Raschid J. Bezama, Mahopac, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/595,550

(22) PCT Filed: Dec. 5, 2003

(86) PCT No.: PCT/US03/38517

§ 371 (c)(1),
(2), (4) Date: Apr. 27, 2006

(87) PCT Pub. No.: WO2005/065936

PCT Pub. Date: Jul. 21, 2005

(65) Prior Publication Data

US 2007/0065647 A1    Mar. 22, 2007

(51) Int. Cl.
B32B 38/04   (2006.01)
C03B 29/00   (2006.01)
(52) U.S. Cl. .................. 156/267; 156/89.11; 156/89.12
(58) Field of Classification Search ............. 156/89.11, 156/89.12, 267; 155/89.11
See application file for complete search history.

(56) References Cited

U.S. PATENT DOCUMENTS

| 4,753,694 | A | * | 6/1988 | Herron et al. ............ 156/89.18 |
| 5,370,760 | A | | 12/1994 | Mori et al. |
| 5,801,073 | A | | 9/1998 | Robbins et al. |
| 6,221,193 | B1 | | 4/2001 | Cassidy et al. |
| 6,347,037 | B2 | | 2/2002 | Iijima et al. |
| 6,627,020 | B2 | * | 9/2003 | Natarajan et al. ........ 156/89.12 |
| 2003/0041947 | A1 | | 3/2003 | Natarajan et al. |
| 2003/0096085 | A1 | | 5/2003 | Knickerbocker et al. |
| 2003/0168150 | A1 | * | 9/2003 | Lee et al. ................. 156/89.12 |

OTHER PUBLICATIONS

Supplemental European Search Report, dated Nov. 11, 2009, under Article 153(7) EOC for European Application No. 03819267.0—1212/1715996—PCT/US0338517.

* cited by examiner

*Primary Examiner*—Mark A Osele
*Assistant Examiner*—Nickolas Harm
(74) *Attorney, Agent, or Firm*—Wenjie Li

(57) ABSTRACT

A method to control the post sinter distortion of hot pressing sintered multilayer ceramic laminate by placing a non-densifying structure in the green ceramic laminate prior to sintering. One or more non-densifying structures are placed on one or more ceramic greensheets which are then stacked and laminated to form a green ceramic laminate. The laminate is then sintered and the non-densifying structure will control the dimensions of the hot pressed multilayer ceramic substrate. The method can be used to control post sinter dimensions in MLC substrates manufactured as either single or multi-up substrates by placing the non-densifying structure in the kerf area between the individual product ups prior to sintering.

11 Claims, 5 Drawing Sheets

A - A'

HOT PRESSING CERAMIC DISTORTION CONTROL

BACKGROUND OF THE INVENTION

The present invention is directed to the control of distortion during high temperature processing, and, more particularly, in the hot pressing of metallized multilayer ceramic (MLC) substrates.

In the manufacture of MLC substrates, ceramic greensheets are formed from a casting slurry. The individual ceramic greensheets are personalized with via holes and conductive metal. The ceramic greensheets are then stacked together in a predetermined design sequence to form a green ceramic laminate. After the greensheets are stacked, heat and pressure are applied to the greensheets to provide a green ceramic laminate with continuous conductive metal wiring whose layers will remain contiguous during subsequent processing.

This process of applying heat and pressure to the stacked greensheets is called lamination. The green ceramic laminate is then fired in a process called sintering, where the green laminate is densified under heat and pressure. The process of sintering ceramic under uniaxially applied pressure is also known as hot pressing. When the pressure is applied in all directions, then the sintering process is typically known as hot isostatic pressing. In contrast, free sintering typically refers to the process of sintering under no external load or pressure.

During the hot pressing process, employed primarily for densifying the ceramic and the conductive metal materials in MLC substrates, large volume shrinkage of the MLC substrate typically occurs. More specifically, in the case of hot pressing, when the pressure is applied in one direction, the volume shrinkage experiences significant non-uniform viscous deformation throughout the densifying body. Since both the densification and viscous deformation processes are typically dependent on the sample viscosity, these two processes happen simultaneously but at different deformation rates which are temperature sensitive. In addition, when hot pressing MLC products, the densification process will also be dependent on the distribution of metal phase while being somewhat insensitive to external conditions, mainly because the primary driving force for densification is the ceramic phase surface tension. In contrast, the viscous deformation process will have a strong dependency on all external forces applied to the sample.

In general the ceramic and conductive metal materials have a wide difference in physical and transport properties. The onset of densification and the densification profiles between the ceramic and metal phases differ widely as well. With application of external pressure during the sintering process, some of the differences in densification rates may be reduced when the metal densification rate is sensitive to applied pressure. But the use of uniaxial external pressure during densification creates viscous deformation in the sample as well. The complex densification process of the composite, in conjunction with the viscous deformation rate result in distortion, both in the pattern of the conductive metal features and in the substrate body dimensions.

Distortion is defined as deviation in actual post sinter dimensions from the ideal design dimensions. Distortion in the body dimensions includes deviation in surface flatness called camber. Distortion control in sintering by hot pressing processes requires the conductive metal and the ceramic material to have similar shrinkage rates, the application of external pressure at a rate consistent with the ceramic-metal composite physical properties, and careful selection of the method to apply the pressure to the product. However, even with careful selection of materials, variations in material from lot to lot can result in unpredictable shrinkage due to, for example, contamination or particle size distribution. Further, the application of external pressure to the densifying sample may also introduce processing related variations, such as load variation, which can result in product to product variation on a given sample batch and generate product distortion. In MLC substrates this distortion can manifest itself as substrate warping, substrate camber, and variations in substrate dimensions. High distortion results in product with low yield and increased production costs.

Hot pressing is typically used to densify ceramic-metal composites at lower temperatures than what is needed to complete the same process using a free sintering method. The use of external pressure during densification also helps the control of substrate camber during densification when the difference in shrinkage rate between the ceramic phase and the metal phase is significant and can not be reduced adequately by conventional means such as particle size distribution and material chemistry. In some applications, the use of external pressure is the only manufacturable process feasible to generate a given ceramic-metal composite. But the use of external pressure during sintering introduces many complexities into the sintering process which impact directly on the manufacturing costs.

For example, the use of external pressure during sintering requires the use of specially designed hardware to transfer the pressure to the product under densification. Sintering hardware should not restrict the product heating, cooling, or any chemical reaction involving mass transport, and should not deform significantly under pressure. Also, the hardware used to apply the sintering pressure uses up valuable furnace volume. Thus, higher external sintering pressure and temperature translates directly into more expensive hardware to carry out the already costly sintering process.

Not surprisingly then, the hot pressing process is significantly more expensive than free sintering for a given manufacturing production rate. To reduce cost, each sample being hot pressed may include many final products, which are typically separated in a subsequent post-sinter dicing operation. Unfortunately, the effort to control laminate distortion during hot pressing increases the difficulty significantly when the laminate includes multiple products. This is mainly because in a typical multi-up laminate the space between the individual product samples, or "ups", is free of metallurgy. The viscoelastic properties of the sintering laminates are dependent on metallurgy distribution and therefore multiup laminate sintering inherently has built in variations in physical and transport properties.

The manufacture of MLC substrates involves multiple processes which directly impact the product dimensions and distortion during the sintering step. Extensive effort is expended at increased cost to control the post sinter MLC substrate dimensions. Advances in microelectronic technology has continuously increased the number of chip input/output "I/O", while decreasing the corresponding chip size. This creates a demand for MLC substrates with reduced top surface metal (TSM) interconnect dimensions. Correspondingly the MLC substrate bottom surface I/O pad density needs to be increased. Such a design need increases the challenge of product build, in particular product dimensional control. Therefore, there is a need for cost-effective distortion control in MLC substrate manufacturing.

There are a number of methods employed currently to control substrate dimensions during MLC substrate manufacturing that are applicable to ceramic-metal systems which are densified under free sintering conditions. However, methods which can be used when the densification is done under external pressure are limited. Sometimes, an additional sinter process under pressure is applicable and will reduce ceramic distortion in some material systems. However this process is expensive and results in additional product yield loss. Often this process is not possible. Additionally, tailoring the type of conductive metal used throughout the substrate may be employed to control product distortion, but this is not useful to control global distortion.

Also, this solution is not comprehensive and does not always address the problem of individual product distortion. Selective distribution of the conductive metal throughout the individual product, to the maximum extent possible, can bound individual product distortion but fails to control global distortion problems. Greensheet stack lamination pressure adjustment is sometimes used to control global distortion. However this technique is not as effective when used with hot pressing. Finally, product redesign may be used as a tool to reduce distortion in some cases by adjusting the conductive metal distribution in key areas. However, this is undesirable since it is very costly and impacts new product time to market. The existing procedures and models used to control product dimensions are not fully predictive, and are therefore not dependable and quite limiting.

There are methods proposed by others to improve the dimensional control of electronic packages. Natarajan et al. U.S. Pat. No. 6,627,020, the disclosure of which is incorporated by reference herein, discloses the use of discrete non-densifying structures to control the dimensions of a free sintered multilayer ceramic substrate. Robbins et al. U.S. Pat. No. 5,801,073, the disclosure of which is incorporated by reference herein, discloses a method for producing an electronic packaging device made of dissimilar materials within a package. Robbins discloses a method to achieve minimal overall shrinkage of the package by the use of a high purity reaction bonded silicon nitride as a dielectric ceramic material.

Mori et al. U.S. Pat. No. 5,370,760, the disclosure of which is incorporated by reference herein, discloses a method to reduce the distortion of the metallized features in a ceramic laminate during the lamination process prior to sintering. Mori discloses the use of a die assembly, which is a tool, having an outer portion and an inner portion which can compress the outer peripheral portion of the laminate to a higher degree than the central portion of the laminate. This disclosure does not address the control of distortion induced during the sintering process.

Notwithstanding the prior art there remains a need to minimize the external sintering pressure and control the dimensions of MLC substrates already designed, but which fail to meet their post sinter dimensional requirements, and whose overall distortion is not amenable to the existing dimensional control methods.

These and other purposes of the present invention will become more apparent after referring to the following description considered in conjunction with the accompanying drawings.

BRIEF SUMMARY OF THE INVENTION

The purposes of the present invention have been achieved by providing, according to a first embodiment, a method to control the post sinter dimensions of a multilayer ceramic substrate sintered under load comprising the steps of:

providing at least one first continuous non-densifying structure;

providing at least one personalized ceramic greensheet having a local peripheral kerf area and an external peripheral kerf area;

placing the first continuous non-densifying structure on the local peripheral kerf area of the personalized ceramic greensheet;

placing the personalized ceramic greensheet having the first continuous non-densifying structure in a stack of personalized greensheets;

laminating the stack of personalized ceramic greensheets to form a green ceramic laminate wherein the first continuous non-densifying structure will at least partially control the dimensions of the green ceramic laminate during lamination;

sintering the green ceramic laminate under load to form a multilayer ceramic substrate wherein the first continuous non-densifying structure will at least partially control the dimensions of the multilayer ceramic substrate during sintering.

The method may further comprise the steps of post sinter sizing the multilayer ceramic substrate thereby separating the first continuous non-densifying structure from the multilayer ceramic substrate.

The method may further comprise the steps of:

providing a second continuous non-densifying structure;

placing the second continuous non-densifying structure on the external peripheral kerf area of the personalized ceramic greensheet prior to lamination wherein the second continuous non-densifying structure will at least partially control the dimensions of the green ceramic laminate during lamination, and pre-sinter sizing the green ceramic laminate thereby separating the second continuous non-densifying structure from the green ceramic laminate prior to sintering.

In another embodiment of the present invention there is provided a method to control the post sinter dimensions of a multilayer ceramic substrate which is laminated and sintered under load as a multi-up green ceramic laminate comprising the steps of:

providing at least one first continuous non-densifying structure;

providing at least one personalized ceramic greensheet having a plurality of product samples separated by a local kerf area and having peripheral external kerf area;

placing the first continuous non-densifying structure on the local kerf area of the personalized ceramic greensheet;

placing the personalized ceramic greensheet having the first continuous non-densifying structure in a stack of personalized greensheets;

laminating the stack of personalized ceramic greensheets to form a multi-up green ceramic laminate wherein the first continuous non-densifying structure will at least partially control the dimensions of the multi-up green ceramic laminate during lamination;

sintering the green ceramic laminate under load to form a multi-up multilayer ceramic substrate wherein the first continuous non-densifying structure will at least partially control the dimensions of the multi-up multilayer ceramic substrate during sintering.

The method may further comprise the steps of post sinter sizing the multi-up multilayer ceramic substrate to form individual multilayer ceramic substrates and thereby separating the first continuous non-densifying structure from the individual multilayer ceramic substrates.

The method may further comprise the steps of:

providing at least one second continuous non-densifying structure;

placing the second continuous non-densifying structure on the external peripheral kerf area of the personalized ceramic greensheet prior to lamination wherein the second continuous non-densifying structure will at least partially control the dimensions of the multi-up green ceramic laminate during lamination, and pre-sinter sizing the multi-up green ceramic laminate thereby separating the second continuous non-densifying structure from the multi-up green ceramic laminate prior to sintering.

In another embodiment of the present invention there is provided a multilayer ceramic laminate structure comprising:

a plurality of laminated ceramic greensheets;

at least one personalized ceramic greensheet having a local peripheral kerf area and an external peripheral kerf area;

at least one first continuous non-densifying structure placed on the local peripheral kerf area of the personalized ceramic greensheet.

The multilayer ceramic laminate structure may further comprise at least one second continuous non-densifying structure placed on the external peripheral kerf area.

In another embodiment of the present invention there is provided a multi-up multilayer ceramic laminate structure comprising:

a plurality of laminated ceramic greensheets;

at least one personalized ceramic greensheet having a plurality of product samples separated by a local kerf area and having peripheral external kerf area;

at least one first continuous non-densifying structure placed on the local kerf area of the personalized ceramic greensheet.

The multi-up multilayer ceramic laminate structure may further comprise at least one second continuous non-densifying structure placed on the external peripheral kerf area.

BRIEF DESCRIPTION OF THE DRAWINGS

The features of the invention believed to be novel and the elements characteristic of the invention are set forth with particularity in the appended claims. The Figures are for illustration purposes only and are not drawn to scale.

The invention itself, however, both as to organization and method of operation, may best be understood by reference to the detailed description which follows taken in conjunction with the accompanying drawings in which.

DETAILED DESCRIPTION OF THE INVENTION

During MLC sintering, the green ceramic laminate undergoes a large volume change, typically from about 40% to about 60% shrinkage, to produce the final MLC substrate. In the case of a free sintering process, the MLC substrate shrinks in all three dimensions, typically about 10% to about 20% linearly in each dimension. If the sintering is done under load, then one dimension may experience most of the shrinkage, particularly in the direction of the applied load. This is directly dependent on the method used to apply the sintering pressure to the green ceramic laminate. In both free sintering and sintering under load, the MLC substrate shrinkage occurs during the ceramic densification stage. During this stage the viscosity of the MLC substrate is sufficiently low and allows the internal sintering forces, driven predominantly by surface tension, to shrink the MLC substrate to its final dimensions. The present invention is directed to control distortion during sintering under load.

Interaction between the ceramic and metal phases in the green ceramic laminate determines some of the final MLC substrate dimensions, and consequently defines yield levels. Because of their different physicochemical nature, the metal and ceramic phases densify at a different onset and rate. This difference in densification rate directly contributes to the deviation of the post sinter MLC substrate dimensions from design dimensions, primarily because the metal phase in a typical MLC laminate is not uniformly distributed.

In addition, the use of different types of metallurgy in a given ceramic laminate also contributes to substrate distortion during sintering. Both said distortion inducing factors are unavoidable in MLC manufacturing because they are necessary for the electrical and mechanical interconnection function, which the substrate provides between the integrated circuit chip and electronic card.

The present invention is applicable to any personalized ceramic greensheet. A personalized ceramic greensheet may or may not be metallized. The term "personalized" refers to a ceramic greensheet which has been selected for use in the laminate because of a particular characteristic. While this characteristic is typically the metallized pattern screened on the sheet it could also refer to a particular characteristic of a blank or non-metallized sheet such as its thickness. Where the personalized ceramic greensheet is metallized the conductive metal may be, for example, molybdenum, nickel, copper, tungsten, metal-ceramic conductors and metal-glass conductors. The personalized ceramic greensheet may consist of, for example, alumina, borosilicate glass-ceramic or aluminum nitride.

Figure 1A:
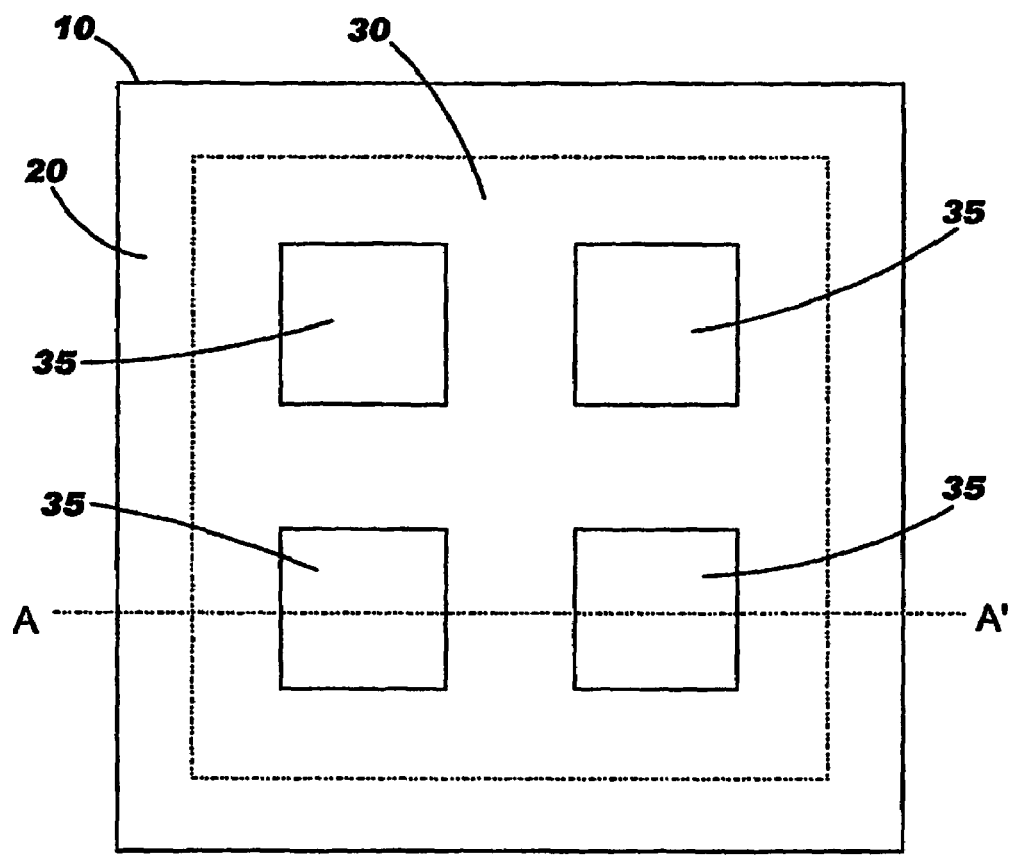
FIG. 1A is a schematic top view of a conventional metallized ceramic greensheet.
Figure 1B:
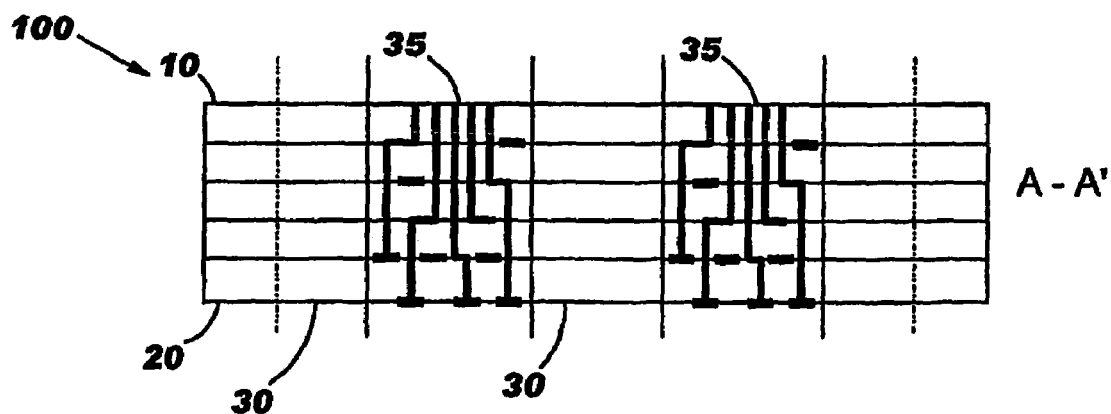
FIG. 1B is a schematic side view of a conventional green ceramic laminate.

Referring to FIG. 1A there is shown a top view of a typical metallized green sheet 10. In this particular example the green sheet 10 contains four ceramic products 35, or four ups, an external kerf area 20 which will be green sized away before sintering, and a local kerf area 30 surrounding and separating the ceramic products 35 which will be separated away from the ceramic products or ups 35 after sintering. This is usually accomplished with a wet sizing process. FIG. 1B shows a schematic view of a green ceramic laminate 100, in this particular case and for the sole purpose of describing this invention, made from 5 different metallized green sheets.

The present invention discloses that the addition of properly tailored non-densifying structures, such as continuous thin metal structures, to the green ceramic laminate kerf area improves the dimensional control of the ceramic product during the hot pressing sintering process, and also allow for external pressure reduction. In addition to shape, the location and thickness of these non-densifying structures must also be selected properly to match the ceramic product 35 design features and the metallized green sheet 10 and laminate 100 characteristics and provide the desired inventive functionality.

Figure 2A:
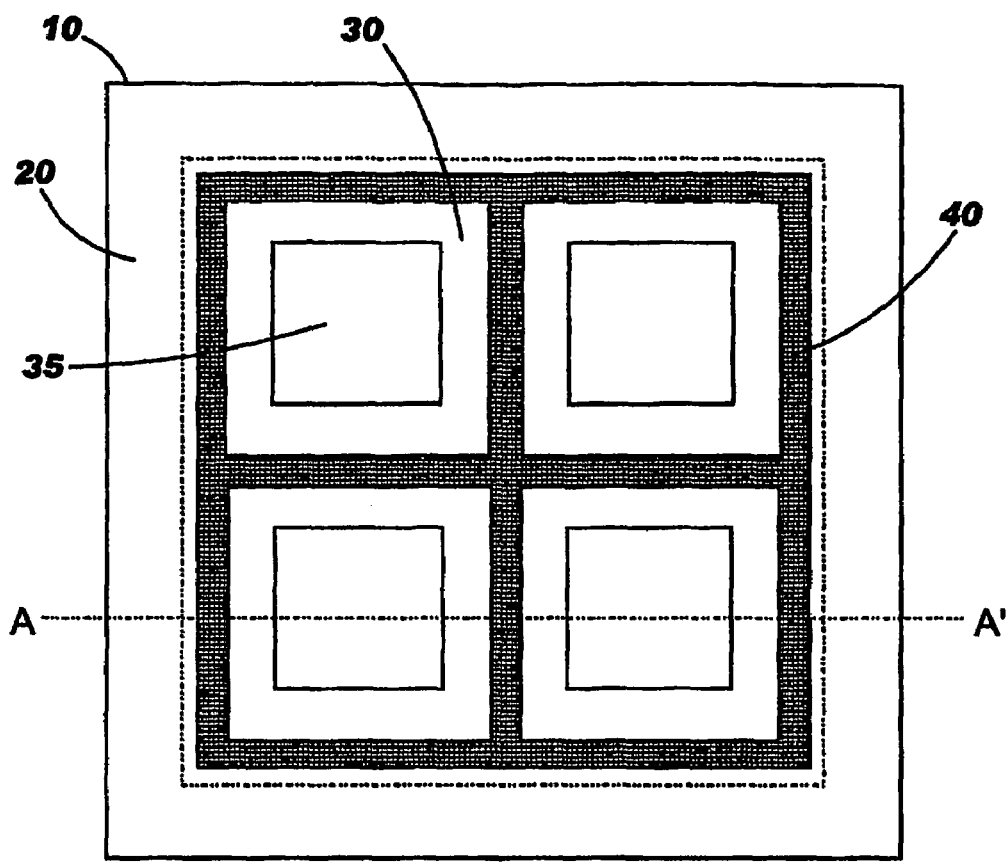
FIG. 2A is a schematic top view of a metallized ceramic greensheet with inventive continuous non-densifying structures added to control distortion.

In one embodiment, and referring to FIG. 2A, the invention provides a method to control global post sinter dimensions of a multi-up laminate during hot pressing sintering by placing a continuous non-densifying structure 40 on a green sheet 10 in the kerf area 30 between the individual products 35 prior to sintering and then separating the continuous non-densifying structure 40 from the products 35 using post sinter wet sizing.

Figure 2B:
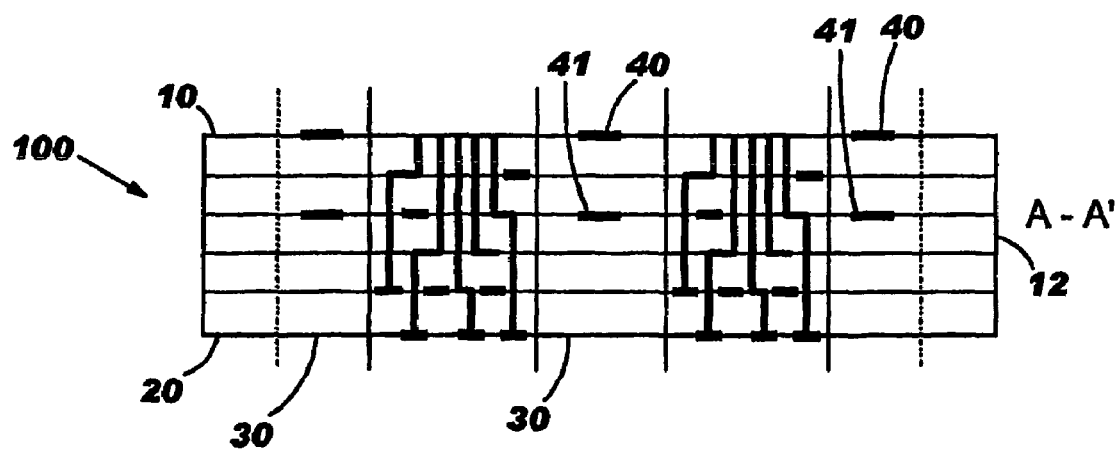
FIG. 2B is a schematic side view of a green ceramic laminate with inventive continuous non-densifying structures added to control distortion.

Referring to FIG. 2B, one or more continuous non-densifying structures, for example 40 and 41, are placed on one or more multi-up ceramic greensheets 10, 12 in the kerf area 30 between the individual products 35. The multi-up ceramic greensheets are stacked and laminated to form a multi-up green ceramic laminate 100 which is then green sized to separate external kerf area 20, and then sintered wherein the continuous non-densifying structures 40 and 41 will control the dimensions of the multilayer ceramic substrate. After sintering, the substrate will be diced into the individual products 35 separating the non-densifying structures 40 and 41 in the local kerf area 30 from each individual multilayer ceramic product 35.

The continuous non-densifying structure 40 can accommodate discontinuities or small gaps in the shape as long as such gaps do not exceed 1 to 1.5 millimeters in size. These gaps are sometimes needed to provide a path for postsinter dicing processing and are allowed as long as the gap width is smaller than the length of the non-densifying structure 40 around the given gap.

In addition, for particular substrate designs containing local non-metallized regions within the metallized design area, individual discrete tailored shapes can be placed in available non-metallized regions as needed to control local distortion. These individual discrete tailored shapes would typically be made of the same material as the continuous non-densifying structure. Typical dimensions, as an example, include a thickness ranging from 0.0003 inch to 0.001 inch, width in the range from 0.002 inch to 0.008 inch and a length determined by the area of the local non-metallized region.

Figure 3A:
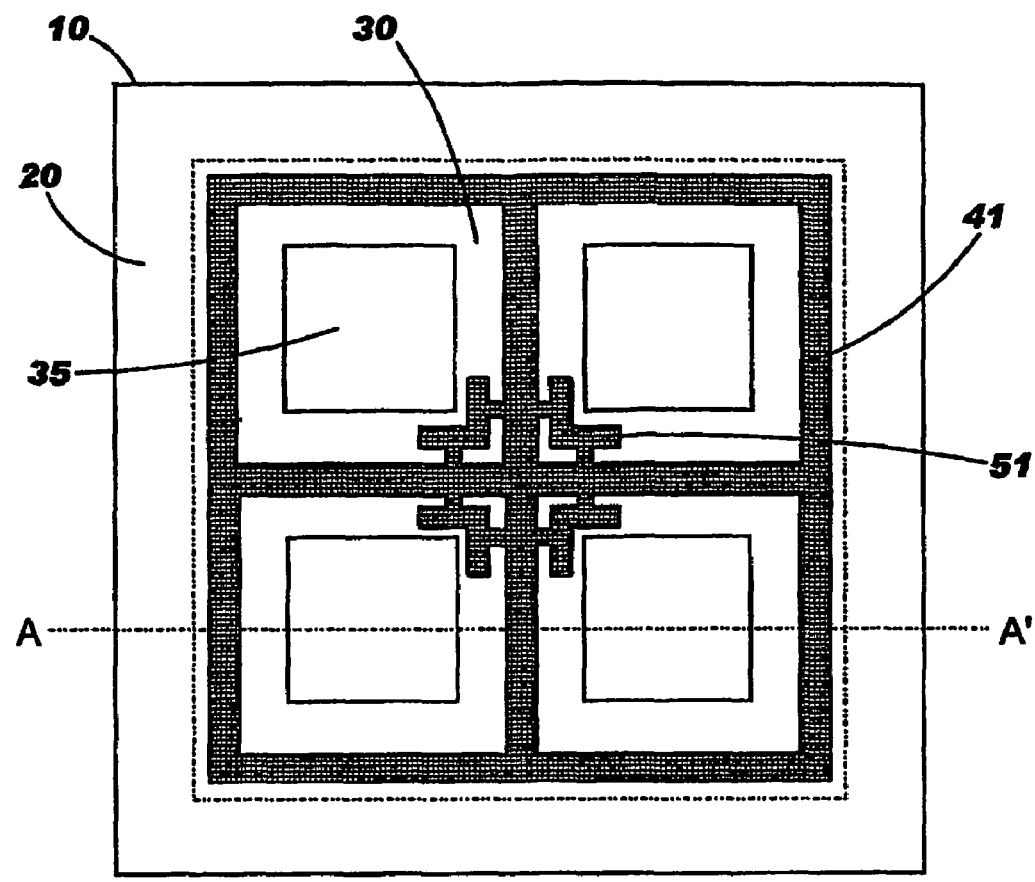
FIGS. 3-5 present schematic views of the use of the inventive continuous non-densifying structures on multiple layers and locations in a green laminate to control distortion.
Figure 3B:
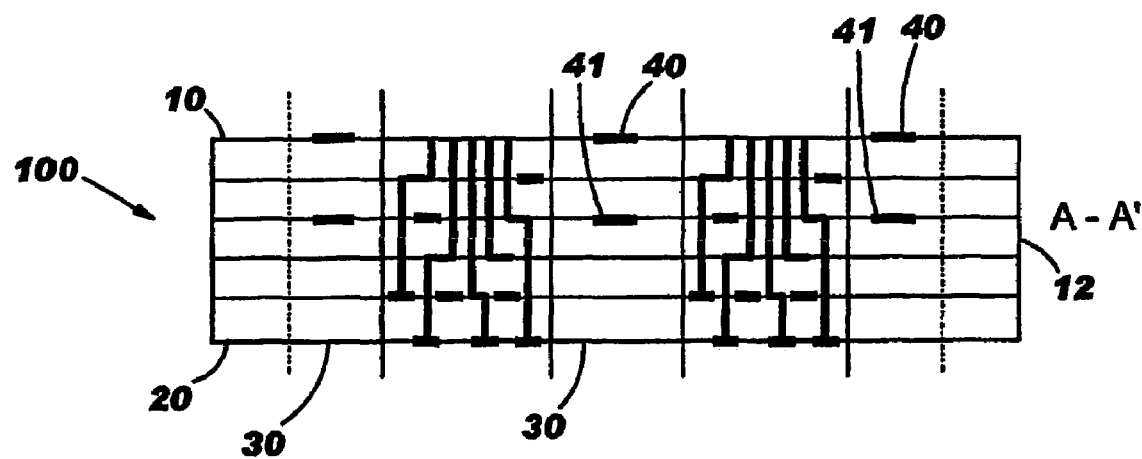

In another embodiment, and referring to FIG. 3A, the invention provides a method to control post sinter dimensions of individual products 35 in a multi-up laminate 100 during hot pressing sintering by placing a continuous non-densifying structure 41 in the kerf area 30 between the individual product ups prior to sintering and then separating the continuous non-densifying structure 41 from the product 35 using post sinter wet sizing. As shown in FIG. 3B, one or more continuous non-densifying structures 41 are placed on one or more multi-up ceramic greensheets 10, 12 in the kerf area 30 between the individual products 35 with properly tailored shapes 51 to counterbalance local densification rate variability within the sintering laminate 100 created by the use of external pressure.

The multi-up ceramic greensheets are stacked and laminated to form a multi-up green ceramic laminate 100 which is then green sized to remove external kerf area 20 and then sintered wherein the continuous non-densifying structures 40 and 41 in conjunction with local non-densifying structures 51 will control the dimensions of the individual products 35 in the multilayer ceramic substrate. After sintering, the substrate will be diced into the individual product samples separating the non-densifying structures 40, 41, and 51 from each individual multilayer ceramic substrate product 35.

Figure 4A:
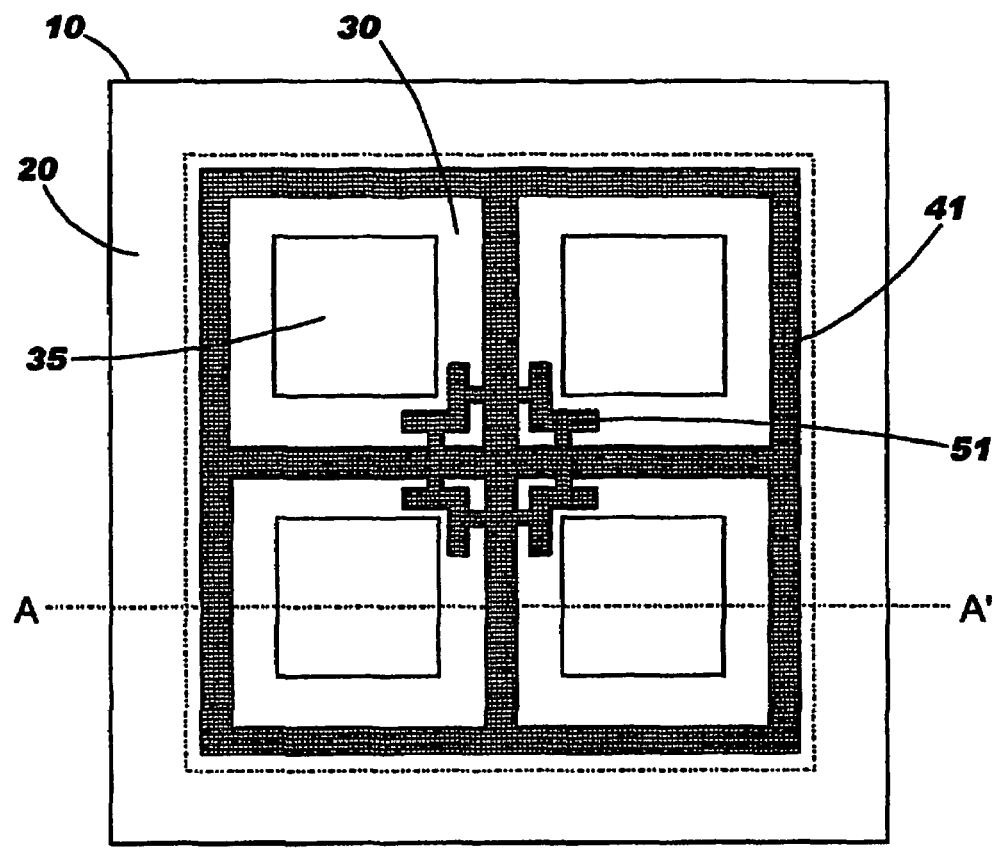

In another embodiment, and referring to FIG. 4A, the invention provides a method to reduce the external sintering pressure required to maintain an acceptable dimensional control in MLC substrates manufactured as a multi-up laminate 100 by placing one or more continuous non-densifying structures 41 in the kerf area 30 of the green sheet 10 under sintering and then separating them from the product using post sinter wet sizing process. In a typical hot press sintering process, only the top and bottom surfaces of the green laminate 100 are prevented from shrinking in the planar or x-y dimensions by friction forces with the hot press plates or sintering fixtures. The addition of non-densifying structures 41 inside the green laminate 100 provide additional planar areas with frictional forces which reduce or prevent ceramic shrinkage also in x-y dimensions.

Figure 4B:
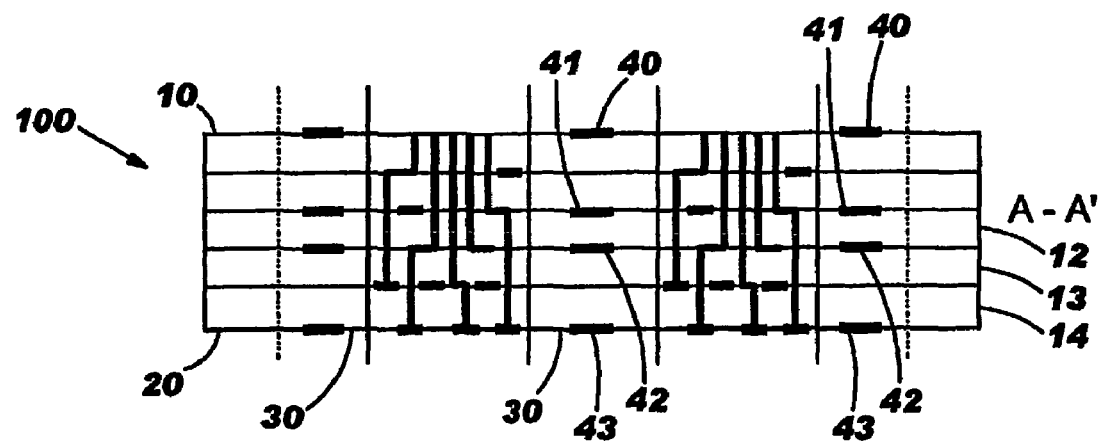

Referring to FIG. 4B, one or more continuous non-densifying structures, 40, 41, 42, and 43, are placed on one or more multi-up ceramic greensheets 10, 12, 13 and 14 in the kerf area 30 between the individual products 35. In this case, the location and shape of the continuous non-densifying structure is selected and designed to reduce the vertical distance between non-shrinking surfaces inside green laminate 100, thus modifying the characteristics of the viscous deformation process step during the laminate densification. The multi-up ceramic greensheets are stacked and laminated to form a multi-up green ceramic laminate 100 which is then sintered wherein the continuous non-densifying structures will control the dimensions of the individual products in the multilayer ceramic substrate. After sintering, the sintered laminate 100 will be sized into the individual products 35 separating the non-densifying structures from each individual multilayer ceramic substrate product 35.

Figure 5A:
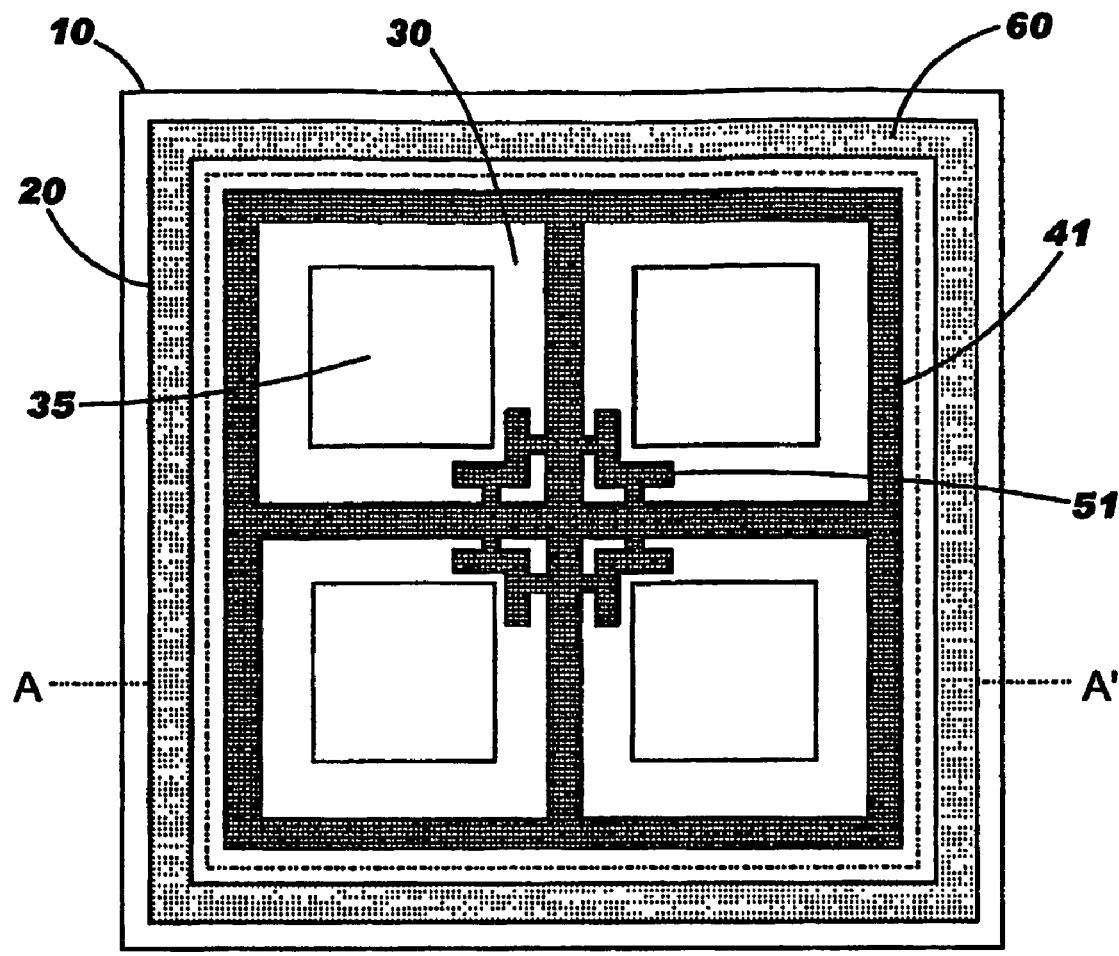

In another embodiment of the invention, and referring to FIG. 5A, a first continuous non-densifying structure 41 is used to control the distortion of a multi-up green ceramic laminate 100 during sintering while a second continuous non-densifying structure 60 is used to control the distortion of the individual products 35 during lamination. The first continuous non-densifying structure 41 is placed on one or more multi-up ceramic greensheets 10 in the area adjacent to the product area, kerf area 30, of the individual ups.

Figure 5B:
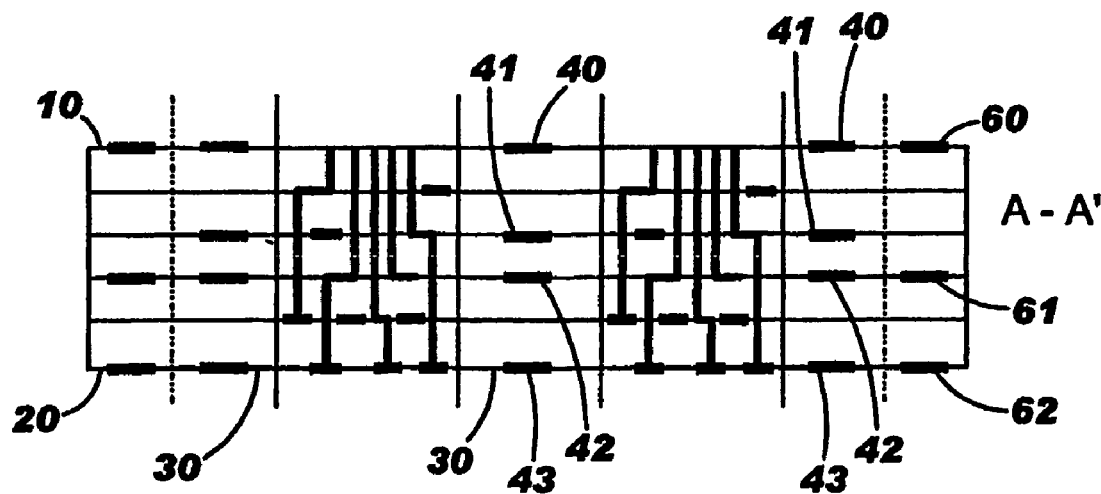

The second continuous non-densyfying structure 60 is placed on one or more multi-up ceramic greensheets 10 in the peripheral, external kerf area 20. As shown in FIG. 5B the multi-up ceramic greensheets are stacked and laminated to form a multi-up green ceramic laminate 100 which is first green sized to produce a multi-up green laminate and then sintered in a hot press. The second continuous non-densifying structure 60 is separated from the green laminate 100 during green sizing step, prior to sintering.

The first and second non-densifying structures will control the distortion of the multi-up ceramic laminate during the lamination step by tailoring the green laminate initial density distribution, then the first continuous non-densfying structure 41 will control the distortion of the multi-up laminate during the hot pressing sintering step. Post sintering, the multi-up substrate is diced to form individual product substrates and the first continuous non-densifying structure is separated from the individual ceramic substrates.

The continuous non-densifying structure can be made from, for example, copper, molybdenum, tungsten, nickel, nickel alloys, stainless steel, dense alumina and zirconia. The continuous non-densifying structure need not be a metal. Metal-ceramic composites, polymers, or ceramic materials which are already densified may also be used. In general metals and polymers have advantages over ceramics as materials for the continuous non-densifying structure since metals and polymers can deform without breaking under load.

The dimensions of the continuous non-densifying structure is tailored to the particular design of the product greensheets. It would be obvious to one skilled in the art to adjust the dimensions of the continuous non-densifying structures for a particular design. Typical dimensions, as an example, include a thickness ranging from 0.0003 inch to 0.001 inch, and width greater than 0.5 millimeters.

While the present invention has been described with regard to a multi-up laminate it is not limited to a multi-up laminate. The present invention is also applicable to a single product laminate or one-up laminate, such as a multi-chip module (MCM).

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method to control the post sinter dimensions of a multilayer ceramic substrate sintered under load comprising the steps of:
   providing at least one first continuous non-densifying structure;
   providing at least one second continuous non-densifying structure;
   providing at least one personalized ceramic greensheet having a local peripheral kerf area that laterally surrounds a ceramic product and an external peripheral kerf area that laterally surrounds an outer perimeter of said local peripheral kerf area, wherein said external peripheral kerf area will be green sized away before sintering said multilayer ceramic substrate and said local peripheral kerf area will be separated away from said multilayer ceramic substrate after sintering said multilayer ceramic substrate;
   placing said at least one first continuous non-densifying structure on the local peripheral kerf area of said at least one personalized ceramic greensheet to surround said ceramic product;
   placing said at least one second continuous non-densifying structure on the external peripheral kerf area of said at least one personalized ceramic greensheet prior to lamination wherein said at least one second continuous non-densifying structure will at least partially control the dimensions of said green ceramic laminate during lamination;
   placing said at least one personalized ceramic greensheet having said at least one first continuous non-densifying structure in a stack of personalized greensheets;
   laminating said stack of personalized ceramic greensheets to form a green ceramic laminate wherein said at least one first continuous non-densifying structure will at least partially control the dimensions of said green ceramic laminate during lamination;
   pre-sinter sizing said green ceramic laminate thereby separating said at least one second continuous non-densifying structure from said green ceramic laminate prior to sintering; and
   sintering said green ceramic laminate under load to form a multilayer ceramic substrate wherein said at least one first continuous non-densifying structure will at least partially control the dimensions of said multilayer ceramic substrate during sintering.

2. The method of claim 1 further comprising the step of post sinter sizing said multilayer ceramic substrate thereby separating said at least one first continuous non-densifying structure from said multilayer ceramic substrate.

3. The method of claim 1 wherein said first and second continuous non-densifying structure is metal, ceramic, polymer, or a combination thereof.

4. The method of claim 1 wherein said first and second continuous non-densifying structure is a metal selected from the group consisting of molybdenum, nickel, copper, tungsten, stainless-steel and zirconia.

5. The method of claim 1 wherein said first and second continuous non-densifying structure has a thickness of approximately 0.0003 inch to 0.001 inch and width of greater than 0.5 millimeters.

6. A method to control the post sinter dimensions of a multilayer ceramic substrate which is laminated and sintered under load as a multi-up green ceramic laminate comprising the steps of:
   providing at least one first continuous non-densifying structure;
   providing at least one second continuous non-densifying structure;
   providing at least one personalized ceramic greensheet having a plurality of product samples separated by and laterally surrounded by a local kerf area and having peripheral external kerf area that laterally surrounds an outer perimeter of said local peripheral kerf area, wherein said external peripheral kerf area will be green sized away before sintering said multilayer ceramic substrate and said local peripheral kerf area will be separated away from said multilayer ceramic substrate after sintering said multilayer ceramic substrate;
   placing said at least one first continuous non-densifying structure on the local kerf area of said at least one personalized ceramic greensheet to surround said plurality of product samples;
   placing said at least one second continuous non-densifying structure on the external peripheral kerf area of said at least one personalized ceramic greensheet prior to lamination wherein said at least one second continuous nondensifying structure will at least partially control the dimensions of said green ceramic laminate during lamination;
   placing said at least one personalized ceramic greensheet having said at least one first continuous non-densifying structure in a stack of personalized greensheets;
   laminating said stack of personalized ceramic greensheets to form a multi-up green ceramic laminate wherein said at least one first continuous non-densifying structure will at least partially control the dimensions of said multi-up green ceramic laminate during lamination;
   pre-sinter sizing said green ceramic laminate thereby separating said at least one second continuous non-densifying structure from said green ceramic laminate prior to sintering; and
   sintering said green ceramic laminate under load to form a multi-up multilayer ceramic substrate wherein said at least one first continuous non-densifying structure will at least partially control the dimensions of said multi-up multilayer ceramic substrate during sintering.

7. The method of claim 6 further comprising the step of post sinter sizing said multi-up multilayer ceramic substrate to form individual multilayer ceramic substrates and thereby separating said at least one first continuous non-densifying structure from said individual multilayer ceramic substrates.

8. The method of claim 6 wherein said at least one first continuous non-densifying structure further comprises tailored shapes to control local distortion within said product samples.

9. The method of claim 6 wherein said first and second continuous non-densifying structure is metal, ceramic, polymer, or a combination thereof.

10. The method of claim 6 wherein said first and second continuous non-densifying structure is a metal selected from the group consisting of molybdenum, nickel, copper, tungsten, stainless-steel and zirconia.

11. The method of claim 6 wherein said first and second continuous non-densifying structure has a thickness of approximately 0.0003 inch to 0.001 inch and width of greater than 0.5 millimeters.

* * * * *